United States Patent [19]

Harris

[11] 4,427,715
[45] Jan. 24, 1984

[54] METHOD OF FORMING EXPANDED PAD STRUCTURE

[75] Inventor: James M. Harris, Palo Alto, Calif.

[73] Assignee: National Semiconductor Corporation, Santa Clara, Calif.

[21] Appl. No.: 401,480

[22] Filed: Jul. 26, 1982

Related U.S. Application Data

[60] Continuation of Ser. No. 180,592, Aug. 25, 1980, abandoned, which is a division of Ser. No. 921,493, Jul. 3, 1978, Pat. No. 4,258,382.

[51] Int. Cl.$^3$ .............................................. B05D 5/12
[52] U.S. Cl. ...................................... 427/96; 427/89; 427/93; 427/123
[58] Field of Search ...................... 427/89, 90, 93, 96, 427/123

[56] References Cited

U.S. PATENT DOCUMENTS

| | | | |
|---|---|---|---|
| 4,099,318 | 7/1978 | Cooper et al. | 427/89 |
| 4,182,781 | 1/1980 | Hooper et al. | 427/93 |
| 4,258,382 | 3/1981 | Harris | 357/71 |

*Primary Examiner*—Norman Morgenstern
*Assistant Examiner*—Richard Bueker
*Attorney, Agent, or Firm*—Gail W. Woodward; Paul J. Winters; Michael J. Pollock

[57] ABSTRACT

A pad for connecting electrical chips in microelectronic circuits includes a passive protective layer overlapping the edge thereof and a bump built up on the connecting pad that had a dimension of the base that is less than that of the pad to prevent the bump from overlapping the edges of the pad and damaging or cracking the underlying structure of the chip during thermocompression bonding of leads to the bump.

7 Claims, 4 Drawing Figures

METHOD OF FORMING EXPANDED PAD STRUCTURE

This is a continuation of application Ser. No. 180,592 filed Aug. 25, 1980 now abandoned, which is a divisional of Ser. No. 921,493 filed July 3, 1978 now U.S. Pat. No. 4,258,382.

BACKGROUND OF THE INVENTION

The present invention relates to microelectronic circuits and pertains particularly to the construction of bumps on conductive pads for microelectronic chips.

Microelectronic circuits may include a number of chips which are connected into the circuit by means of conductors which are connected to bumps on conductive pads on the chip. Connections are made to external sources from a conductive chip by means of electrical conductors such as wire or tape connected to bonding pads. The bonding pads are typically constructed by vacuum evaporating of metal coatings onto a chip. Where tape leads must be bonded to the pads, the pads may be built up by means of a bump built up on the pad and extending upward therefrom. The bumps are aligned with the conductive portion of the pad and produced either by vacuum evaporating or plating of metallic layers over the conductive pad area. The layers are plated on the pad through openings in photoresist layers or the like on the chip.

Because the fundamental object of microelectronic circuits is to make the circuits and elements as small as possible. The conductive pads and bumps must be as small as possible in order not to consume excess space. The bumps are typically built up on the pads to provide a structure to which tape leads are connected by some form of welding or soldering technique. One technique of connection of such leads is by thermocompression bonding. This requires the application of a combination of temperature and pressure to the pad and tape during the bonding process. It has been found that a high number of chips crack in the silicon dioxide layer beneath the pad structure as a result of this bonding technique.

The fabrication techniques presently used result in the base of the bump structure extending outward and overlapping the edge of the bonding pad. It has been found that this prevents the normal thermal expansion of the bonding pad during thermocompression bonding and thus results in cracking of the underlying oxide layer.

Since this cracked oxide may lead to reliability failures, it is desirable that some means be available to prevent the cracking of the oxide layer during the bonding of leads to a pad structure.

SUMMARY AND OBJECTS OF THE INVENTION

Accordingly, it is the primary object of the present invention to overcome the above problems of the prior art.

Another primary object of the present invention is to provide a pad structure which avoids the cracking of the underlying oxide layer during the bonding operation.

In accordance with the primary aspect of the present invention, a pad and bump structure is constructed such that the periphery of the pad structure extends outward beyond the periphery or base of the bump structure such that the base portion of the bump does not overlap the edges of the bonding pad.

BRIEF DESCRIPTION OF THE DRAWINGS

The above and other objects and advantages of the present invention will become apparent from the following description when read in conjunction with the drawings, wherein.

DETAILED DESCRIPTION OF A PREFERRED EMBODIMENT

Figure 1:
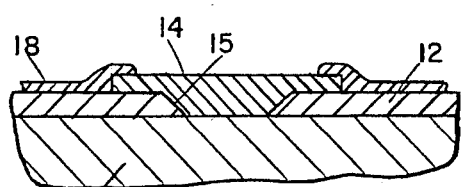
FIG. 1 is a sectional view of a typical prior art bonding pad mounting
Figure 2:
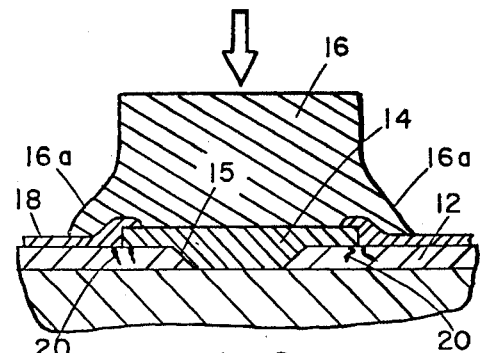
FIG. 2 illustrates the bump attachment to the bonding pad.

Turning now to the drawings, there is illustrated in FIGS. 1 and 2 typical examples of the prior art. In FIG. 1, a substrate 10 including a coating of silicon dioxide 12. A bonding pad 14 is connected to the chip through a window 15 for connecting the chip to external components of a circuit. The bonding pad 14 in the conventional microelectronic device or chip is approximately 3.8 mils. This is the smallest practical size for current manufacturing techniques. The chip is usually connected in a circuit by means of tape leads connected to bumps which are built up on and aligned with bonding pads on the underlying substrate. The bump is typically approximately the same size (i.e. 3.0 to 3.8 mils) as the pad. The edge of pad 14 is overlapped by a layer of passivation protection material such as polysilicon glass (PSG). In the conventional construction, a bump 16, as shown in FIG. 2, is built up on the pad 14 by means of electroplating and the like. The electroplating is carried out in the usual manner by plating into openings in photoresist. Where the pad and bump are approximately the same size, the base of the bump will form a skirt 16a which overlaps the edges of the pad. The edges of the pad 16 are overlapped by a layer of passivation protection material 18 such as that typically referred to as vapox. Some configurations may use sputtered quartz on siliconnitride for the passivation protection layer.

During the bonding of the tape leads to the bump, force is applied as shown by the arrow in FIG. 2, together with heat. It has been found during this operation that cracks shown at 20 develop in the silicon dioxide layer beneath the bonding pad.

Applicant has recently discovered that this resulting crack in the silicon dioxide layer is apparently the result of the skirt 16a of the bump 16 which overlies the bonding pad 14 extending partially downward overlapping the edges thereof. This results in the overlying skirt 16a preventing the expansion of the bonding pad 14 when force is applied thereto for the bonding purposes. It has been shown that this is the major cause of the cracking of the underlying silicon dioxide layer during the bonding process. Accordingly, the present invention was devised to eliminate this cracking during this bonding process.

Figure 3:
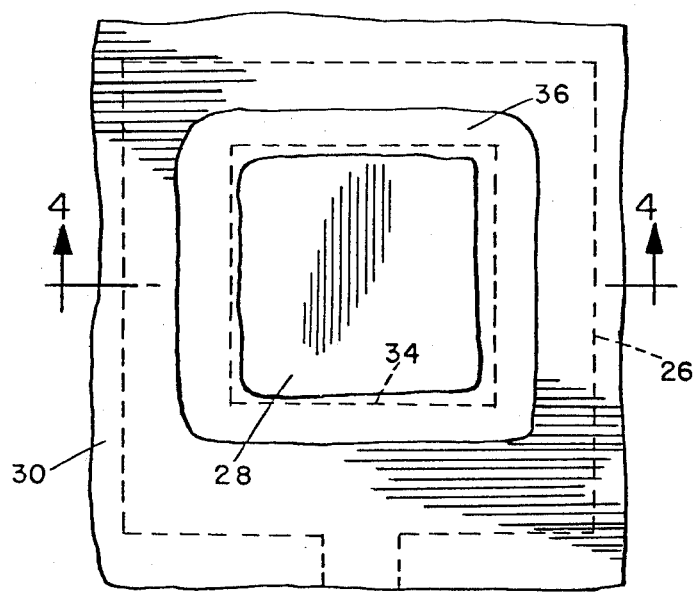
FIG. 3 is a top plan view of an improved bonding pad according to the present invention.
Figure 4:
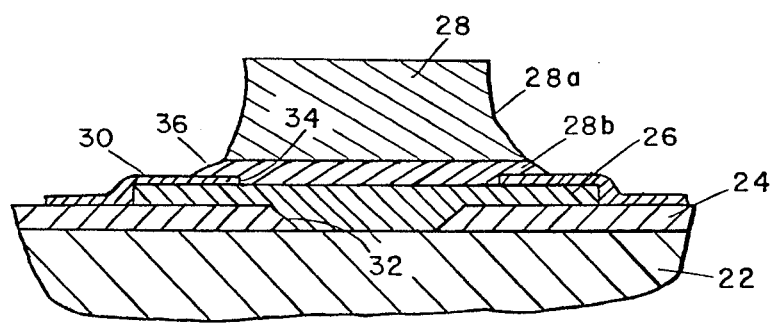
FIG. 4 is a sectional view taken on line 4—4 of FIG. 3.

Applicant devised the structure and method of the present invention, as illustrated in FIGS. 3 and 4, to overcome this problem of the prior art. In accordance with applicant's invention a substrate 22 having an oxide layer 24 is provided with a bonding pad 26. The bonding pad 26 is of an enlarged area as shown to insure that a bump 28 of the preferred size formed thereon will not overlap the edges thereof. The edges of the bonding pad are typically covered or overlapped by a vapox layer 30 or other passivation material for passivation protection purposes. The pad 26, as illustrated, connects through a window 32 in the oxide layer 24 to the substrate 22. The pad may connect to the substrate at a remote location. The bump 28 is shown for illustrative purposes as being made up of two layers of metal 28a and 28b. The bump connects to pad 26 through a window 34 in the vapox layer 30.

In a typical construction, the bumps may range anywhere from 1 to 2 mils in height depending upon pad spacing, dimensions and the particular application. The height of the bump is typically less than one half the bump diameter or width. The preferred width of the pad is about 3.8 mils on each side. The size of the typical bump and pad presents a problem in sizing the size of the bump to less than the width of the pad. Accordingly, it is necessary to expand the pad and insure that the upper surface of the pad exceeds in area the lower surface or base of the bump. In other words, the pad must be sufficiently large in surface area to insure that the base of the bump does not overlap the edges of the pad.

Thus, in this arrangement, a combination pad and bump is constructed wherein the surface area of the pad exceeds the base area of the overlying bump by a sufficient amount to accommodate both sizing and placing tolerances. With such an arrangement the skirt 36 of the bump does not overlie the perimeter or a portion of the edge of the pad, preventing it from expanding during the force applied for bonding purposes.

The minimum size bump for bonding consideration is approximately 3.2 mils. This is the top dimensions with the bottom dimension being 0.2 to 0.3 mils greater. The bump must be positioned in contact with the pad such that it covers the window in the vapox layer. The opening in the vapox layer is typically 0.2 to 0.3 mils on the side smaller than the pad. This makes it 0.4 to 0.6 mils smaller in area than that of the pad.

Both the alignment and the sizing tolerances must be taken into consideration when sizing the bump and pad relative to each other. The base of the bump must be within the area of the pad. This is analogous to the fitting of a series of squares inside one another. The innermost squares being the opening in the Vapox; the next being the base of the bump; the outermost being the pad. (None of the squares are allowed to be coincident). Thus, in order to accommodate both the alignment tolerances, this is the alignment of the bump within the pad, and the manufacturing tolerances, that is the sizing tolerances permissible of the bump, the pad must be 5 mils on each side.

The process variation for the sizing of the bump permits the base of the bump to be within 3.6 to 3.8 mils in variations. The vapox window must be a minimum of 3.2 up to 3.4 mils for wire bonding considerations. Thus, to fit the bump on the pad without an overlap in the base of the pad, the minimum size for the pad must be 5 mils on each side. The base of the bump on the pad can be as great as 4.1 mils which must fit on the pad within an alignment tolerance of 0.2 to 0.3 mils on a side which requires that the pad be a minimum of 4.7 mils. Thus, the pad is preferably constructed to be approximately 5 mils in order to accommodate both the alignment tolerances and the manufacturing tolerances of the bump.

In an alternative construction, the bump can be formed on the tape and then bonded to the pad. In any event the critical feature is that the base of the bump overlap the edges of the passive protection layer but not overlap the edges of the pad. In other words the base of the bump must have a dimension that falls between that of the window and that of the pad and be located to cover the window without overlapping the edges of the pad.

Thus, in carrying out the invention, the pad is specified to have approximately 5.0 mils on a side in its dimension and is formed on a substrate in accordance with the invention. The tolerances of the pad permits it to be slightly smaller thus accommodating a bump having a base varying between 3.6 and 3.8 mils on a side with an alignment variation of from 0.2 to 0.3 mils. Thus, the bump is insured to be properly positioned on the pad without overlapping the edges thereof.

The method of the invention is carried out by the steps of selecting a substrate having a window for connections thereto, forming a pad structure having a predetermined lateral dimension overlying said window, forming a bump in substantial alignment with said pad and having lateral dimensions sufficiently smaller than the lateral dimensions of said pad to accommodate for both lateral misalignment and manufacturing tolerances of the bump, the bump being formed on said pad without overlapping any lateral edge thereof.

The preferred construction includes the step of forming a layer of vapox overlying the edges of said pad, leaving a window in substantial alignment with the center of said pad, and the step of forming the bump includes forming said bump to overlap the edges of the layer of vapox without overlapping the edges of said pad. The step of forming the pad is carried out to provide a lateral dimension on either side greater than needed for practical manufacturing tolerances of placing the bump totally within the pad. The formation of the bump is carried out so as to have a minimum size of 3.2 mils or such minimum dimension as required by the bonding (to the tape) operation. The manufacturing tolerance and the alignment tolerances are each selected to range from 0.2 to 0.3 mils.

While I have illustrated and described my invention by means of specific embodiments, it is to be understood that numerous changes and modifications may be made in the invention without departing from the spirit and scope of the invention as defined in the appended claims.

Having described my invention, I now claim:

1. A method of forming a bump and pad combination for the connection of conductor leads to a substrate comprising the steps of selecting a substrate having a window for connection thereto:

forming a pad structure having a predetermined lateral dimension from a metal layer which is in contact with said window, forming a layer of passive protection material overlying the edges of said pad, leaving an opening in substantial alignment with the center of said pad, and forming a bump in alignment with the center of said pad, to substantially overlap the edges of the layer of protective material over the entire periphery of said opening, and having lateral dimensions sufficiently smaller than the lateral dimensions of said pad to accommodate for both lateral misalignment and manufacturing tolerance of the bump, and locating said bump on said pad without any portion of said bump overlapping any lateral edge of said pad.

2. The method of claim 1 wherein the step of forming the pad includes forming said pad to have a lateral dimension of no more than 5.0 mils on either side.

3. The method of claim 2 wherein the step of forming the bump includes forming said bump to have a minimum size of 3.2 mils.

4. The method of claim 3 wherein said manufacturing tolerance and said alignment tolerances are each from 0.2 to 0.3 mils.

5. The method of claim 1 wherein the step of forming the bump includes forming said bump to have a base with a minimum size of 3.2 mils.

6. The method of claim 1 wherein said manufacturing tolerance and said misalignment tolerance of said opening are each selected to fall within a range of from 0.2 to 0.3 mil.

7. The method of claim 5 wherein said manufacturing tolerance and said misalignment tolerance of said bump are each selected to fall within a range of from 0.2 to 0.3 mil.

* * * * *